(12) United States Patent
Babcock

(10) Patent No.: US 8,455,980 B2
(45) Date of Patent: Jun. 4, 2013

(54) SCHOTTKY-CLAMPED BIPOLAR TRANSISTOR WITH REDUCED SELF HEATING

(75) Inventor: Jeffrey A. Babcock, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 111 days.

(21) Appl. No.: 13/178,629

(22) Filed: Jul. 8, 2011

(65) Prior Publication Data
US 2013/0009271 A1 Jan. 10, 2013

(51) Int. Cl.
*H01L 29/66* (2006.01)

(52) U.S. Cl.
USPC .......... 257/565; 257/280; 257/E27.015; 257/E27.019; 438/309; 438/328

(58) Field of Classification Search
USPC .... 438/202–204, 309, 311, 313, 328; 257/47, 257/197, 280, 557, 565, E27.015, E27.019
See application file for complete search history.

(56) References Cited

U.S. PATENT DOCUMENTS
7,755,106 B2  7/2010 Brar

OTHER PUBLICATIONS
Chen, T. et al., "Footprint Design Optimization in SiGe BiCMOS SOI Technology", Bipolar/BiCMOS Circuits and Technology Meeting, 2008, pp. 208-211.

*Primary Examiner* — David Vu
(74) *Attorney, Agent, or Firm* — Eugene C. Conser; Wade J. Brady, III; Frederick J. Telecky, Jr.

(57) ABSTRACT

The self heating of a high-performance bipolar transistor that is formed on a fully-isolated single-crystal silicon region of a silicon-on-insulator (SOI) structure is substantially reduced by forming a Schottky structure in the same fully-isolated single-crystal silicon region as the bipolar transistor is formed.

6 Claims, 4 Drawing Sheets

SCHOTTKY-CLAMPED BIPOLAR TRANSISTOR WITH REDUCED SELF HEATING

BACKGROUND OF THE INVENTION

1. Field of the Invention

The present invention relates to bipolar transistors and, more particularly, to a Schottky-clamped bipolar transistor with reduced self heating.

2. Description of the Related Art

A bipolar transistor is a well-known structure that has an emitter, a base connected to the emitter, and a collector connected to the base. The emitter has a first conductivity type, the base has a second conductivity type, and the collector has the first conductivity type. For example, an npn bipolar transistor has an n-type emitter, a p-type base, and an n-type collector.

An npn bipolar transistor turns on when the voltage on the p-type base exceeds the voltage on the n-type emitter by approximately 0.7V, thereby forward biasing the junction. When the base-to-emitter junction becomes forward biased, the operation of the bipolar transistor depends on the voltage present on the collector.

When the voltage on the n-type collector is greater than the voltage on the p-type base, the base-to-collector junction is reverse biased and the transistor enters an active mode of operation. In this mode, a large number of electrons flow into the p-type base from the n-type emitter across the forward biased junction. A large portion of these electrons are captured by the electric field that lies across the reverse-biased base-to-collector junction, and then collected by the collector.

Alternately, when the voltage on the n-type collector is less than the voltage on the p-type base by approximately 0.7V, the base-to-collector junction becomes forward biased and the transistor enters a saturation mode of operation. In the saturation mode of operation, the transistor provides high current conduction from the collector to the emitter.

The saturation mode of operation is not preferred for high-frequency applications because once the bias voltages change, it takes a relatively long period of time for the transistor to recover from operating in the saturation mode. Thus, due to the long recovery time, bipolar transistors which operate in the saturation mode typically have a limited operating frequency.

To prevent a bipolar transistor from entering into the saturation mode, a Schottky diode is commonly placed between the base and collector, such that the anode (input) of the Schottky diode is connected to the base and the cathode (output) of the Schottky diode is connected to the collector.

In operation, a Schottky diode typically has a forward voltage drop of approximately 0.3V-0.4V. Thus, when the base-to-collector junction of a bipolar transistor is clamped by a Schottky diode, the base can never rise more than 0.3V-0.4V above the collector. As a result, the base-to-collector junction of a Schottky-clamped bipolar transistor can never become forward biased and, as a result, can never enter into the saturation mode.

FIG. 1 shows a cross-sectional view that illustrates an example of a prior-art Schottky-clamped bipolar transistor 100. As shown in FIG. 1, Schottky-clamped bipolar transistor 100 includes a Schottky diode 110 and an npn bipolar transistor 112. As further shown in FIG. 1, Schottky-clamped bipolar transistor 100 utilizes a silicon-on-insulator (SOI) wafer which has been conventionally processed to have a bulk region 114, an n-single-crystal silicon layer 116, and a buried isolation layer 118 that lies between and electrically isolates single-crystal silicon layer 116 from bulk region 114.

In addition, the SOI wafer has also been conventionally processed to have a deep trench isolation (DTI) structure 120 and a number of shallow trench isolation (STI) structures 122. DTI structure 120 extends through single-crystal silicon layer 116 to touch isolation layer 118 and form a large number of fully-isolated single-crystal silicon regions 124, including a fully-isolated n-single-crystal silicon region 124-1 that supports Schottky diode 110 and a fully-isolated n-single-crystal silicon region 124-2 that supports bipolar transistor 112. The STI structures 122, in turn, include an STI ring 122-1 that is formed in fully-isolated single-crystal silicon region 124-1, and an STI region 122-2 that is formed in fully-isolated single-crystal silicon region 124-2.

As also shown in FIG. 1, Schottky diode 110 includes an n+ ring 130 and a p+ guard ring 132 that are formed in fully-isolated single-crystal silicon region 124-1 on opposite sides of STI ring 122-1. Schottky diode 110 also includes a metal ring 134 that touches the top surface of n+ ring 130, and a metal region 136 that touches the top surface of fully-isolated single-crystal silicon region 124-1 and p+ guard ring 132. Metal ring 134 and metal region 136 are commonly formed with a silicide, such as platinum silicide.

As additionally shown in FIG. 1, bipolar transistor 112 includes a collector structure 140. Collector structure 140, in turn, includes an n+ buried layer 142 that is formed in fully-isolated single-crystal silicon region 124-2 to touch the top surface of buried isolation layer 118, an n-well 144 that is formed in fully-isolated single-crystal silicon region 124-2 to extend down and touch n+ buried layer 142, and an n+ collector sinker region 146 that is formed in fully-isolated single-crystal silicon region 124-2 to extend down and touch n+ buried layer 142.

Bipolar transistor 112 also includes a p-type silicon germanium (SiGe) base 150 that touches the top surface of fully-isolated single-crystal silicon region 124-2, and an n-type silicon emitter 152 that touches the top surface of SiGe base 150. A SiGe base, which forms a heterojunction bipolar transistor (HBT), is commonly used in high-frequency applications.

As further shown in FIG. 1, Schottky-clamped bipolar transistor 100 includes a non-conductive layer 154 that touches the top surfaces of DTI structure 120, the STI structures 122, metal ring 134, metal region 136 SiGe base 150, and emitter 152. Transistor 100 further includes a number of contacts 156 that extend through non-conductive layer 154 to make electrical connections with metal ring 134, metal region 136, a silicided top surface of n+ collector sinker region 146, SiGe base 150, and silicon emitter 152. In addition, as schematically illustrated, metal region 136 of Schottky diode 110 is electrically connected to SiGe base 150, while metal ring 134 of Schottky diode 110 is electrically connected to the silicided top surface of n+ collector sinker region 146.

In operation, metal region 136 functions as the anode of Schottky diode 110 and silicon region 124-1 functions as the cathode of Schottky diode 110. In addition, n+ ring 130 functions as the cathode contact, while p+ guard ring 132 reduces the leakage current. As a result, when the voltage applied to SiGe base 150, and thereby metal region 136, rises above the voltage applied to n+ collector sinker region 146 by approximately 0.3V-0.4V, a current flows from SiGe base 150 to metal region 136 to n+ ring 130 to n+ collector sinker region 146. On the other hand, when the voltage applied to metal region 136 falls below the voltage applied to n+ collector sinker region 146, substantially no current flows from n+ ring 130 to metal region 136.

One of the drawbacks of Schottky-clamped bipolar transistor 100 is that DTI structure 120 significantly limits the lateral dissipation of heat, which limits the heat that can be generated by bipolar transistor 112 which, in turn, limits the operation of bipolar transistor 112. Heat is produced when current flows through a bipolar transistor. This type of heating, which is known as self heating, increases as the density of the current increases.

As bipolar transistors are scaled downward, the density of the current flowing through the transistors increases, which produces increasing levels of heat. Thus, as the transistors are scaled downward and the levels of heat rise through self heating, the inability to significantly dissipate heat laterally through DTI structure 120 affects the conductivity of the transistor and limits the safe operating area of the transistor.

One approach to reducing self heating is to increase the length L shown in FIG. 1, which is the distance from the edge of the shallow portion of the DTI structure 120 that lies below SiGe base 150 to the edge of the deep portion of the same DTI structure 120. FIG. 2 shows a prior-art graph 200 that illustrates a collector-emitter voltage V versus a collector current A for different values of the length L. As shown in FIG. 2, the upper portion of the collector current curve can be substantially improved (flattened out) by increasing the length L from 0.25 μm to 5.00 μm.

Although the collector current curve can be substantially improved by increasing the length L from 0.25 μm to 5.00 μm, increasing the length L increases the area or footprint of a fully-isolated single-crystal silicon region, such as fully-isolated single-crystal silicon region 124-2. However, increasing the footprint of fully-isolated single-crystal silicon region 124-2 is not a realistic solution when the goal is to reduce the footprints of the devices and the die, which includes reducing the footprint of the fully-isolated single-crystal silicon regions. Thus, there is a need for an approach to reducing the self heating experienced by a SiGe bipolar transistor in a fully-isolated single-crystal silicon region.

DETAILED DESCRIPTION OF THE INVENTION

Figure 1:
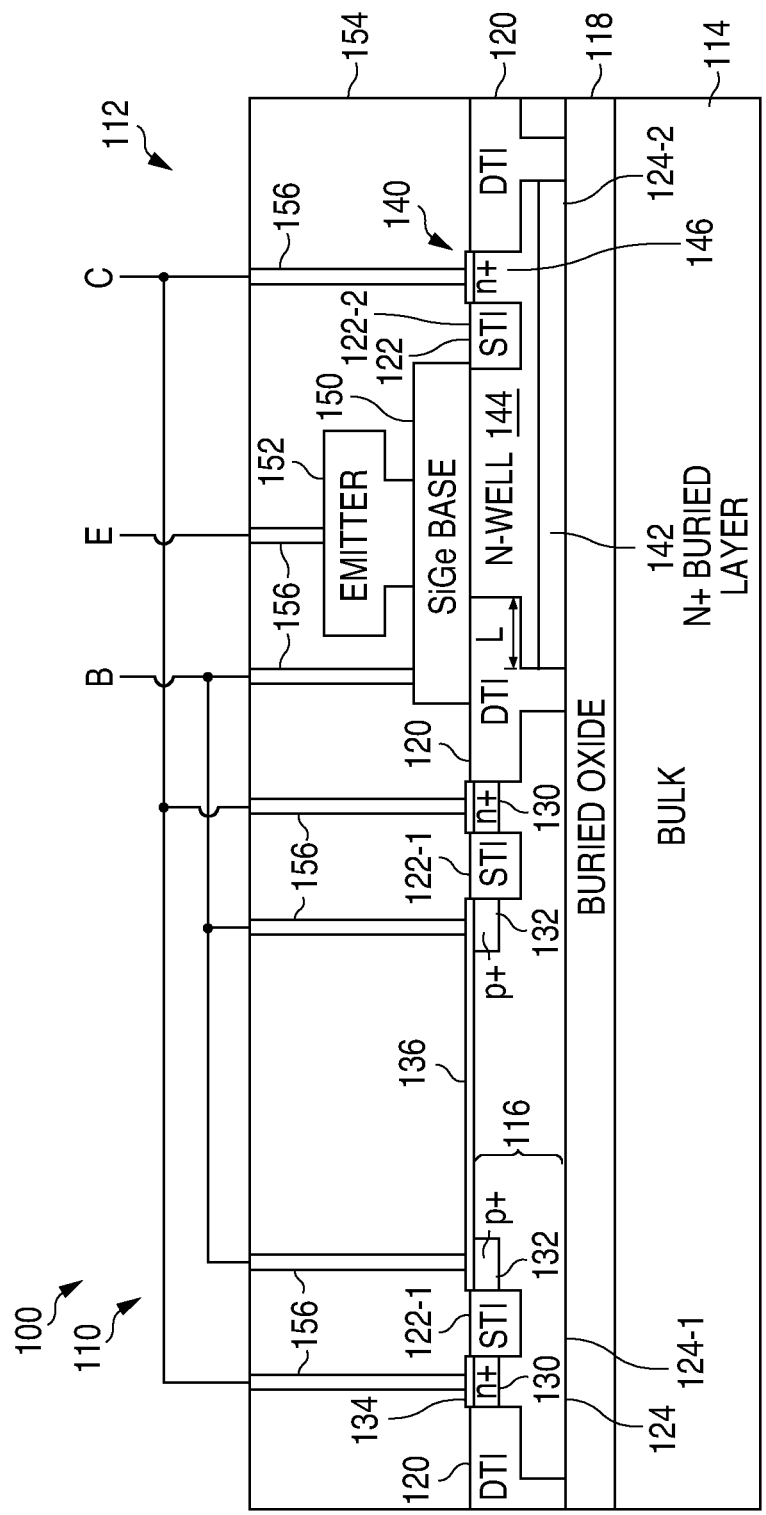
FIG. 1 is a cross-sectional view illustrating an example of a prior-art Schottky-clamped bipolar transistor 100.
Figure 2:
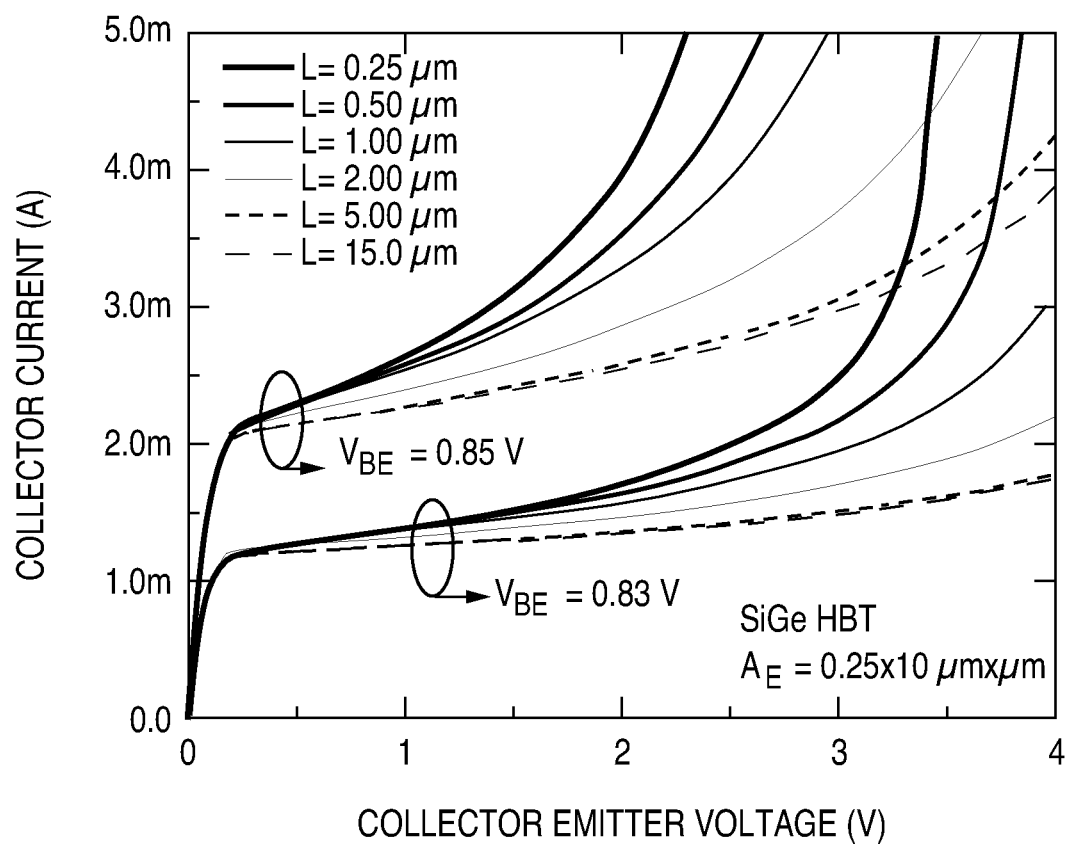
FIG. 2 is a prior-art graph illustrating a collector-emitter voltage V versus a collector current A for different values of the length L.
Figure 3:
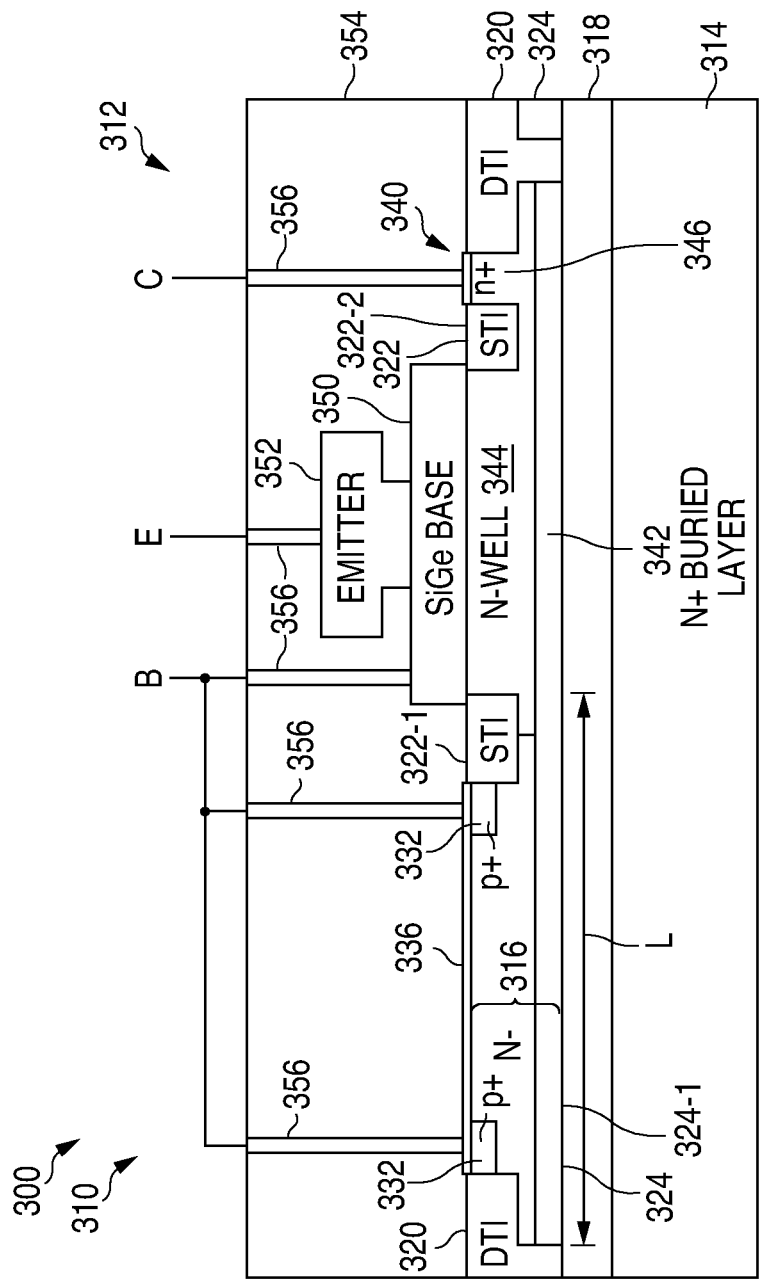
FIG. 3 is a cross-sectional view illustrating an example of a Schottky-clamped bipolar transistor 300 in accordance with the present invention.

FIG. 3 shows a cross-sectional view that illustrates an example of a Schottky-clamped bipolar transistor 300 in accordance with the present invention. As described in greater detail below, Schottky-clamped bipolar transistor 300 reduces self heating by forming a Schottky structure in the same fully-isolated single-crystal silicon region as the bipolar transistor.

As shown in FIG. 3, Schottky-clamped bipolar transistor 300 includes a Schottky structure 310 and an npn bipolar transistor 312. As further shown in FIG. 3, Schottky-clamped bipolar transistor 300 utilizes a silicon-on-insulator (SOI) wafer which has been conventionally processed to have a bulk region 314, an n-single-crystal silicon layer 316, and a buried isolation layer 318 that lies between and electrically isolates single-crystal silicon layer 316 from bulk region 314.

In addition, the SOI wafer has also been conventionally processed to have a deep trench isolation (DTI) structure 320 and a number of shallow trench isolation (STI) structures 322. DTI structure 320 extends completely through n-single-crystal silicon layer 316 to touch isolation layer 318 and form a large number of n-single-crystal silicon regions 324 that touch isolation layer 318. (One single-crystal silicon region 324 and a small portion of a second are shown for clarity.)

Each single-crystal silicon region 324 is horizontally spaced apart and horizontally electrically isolated from each other single-crystal silicon region by DTI structure 320. Each single-crystal silicon region 324 is vertically spaced apart and vertically electrically isolated from bulk region 314 by isolation layer 318. Thus, each n-single-crystal silicon region 324 is fully laterally electrically isolated from each other n-single-crystal silicon region 324.

In the present invention, the n-single-crystal silicon regions 324 include an n-single-crystal silicon region 324-1 that supports both Schottky structure 310 and bipolar transistor 312. The STI structures 322, in turn, include an STI region 322-1 and an STI region 322-2 that are both formed in single-crystal silicon region 324-1. As shown, the bottom surfaces of the STI regions 322-1 and 322-2 are spaced apart from a top surface of isolation layer 318.

As also shown in FIG. 3, Schottky structure 310 includes a p+ guard ring 332 that is formed in n-single-crystal silicon region 324-1, and a metal region 336 that touches the top surface of n-single-crystal silicon region 324-1 and p+ guard ring 332. Metal region 336 can be formed with a silicide, such as platinum silicide. The portion of n-single-crystal silicon region 324-1 that is touched by metal region 336 has a dopant concentration that is less than the dopant concentration of buried layer 342.

As additionally shown in FIG. 3, bipolar transistor 312 includes a collector structure 340. Collector structure 340, in turn, includes an n+ buried layer 342 that is formed in single-crystal silicon region 324-1 to touch the top surface of buried isolation layer 318, an n-well 344 that is formed in single-crystal silicon region 324-1 to extend down from the top surface of single-crystal silicon region 324-1 and touch n+ buried layer 342, and an n+ collector sinker region 346 that is formed in single-crystal silicon region 324-1 to extend down and touch n+ buried layer 342 and n-well 344. In the present example, n+ buried layer 342 lies directly vertically below metal region 336, and lies below and spaced apart from the bottom surfaces of the STI regions 322-1 and 322-2.

As further shown in FIG. 3, bipolar transistor 312 additionally includes a p-type silicon germanium (SiGe) base 350 that touches a portion of the top surface of n-single-crystal silicon region 324-1 and the top surfaces of the STI regions 322-1 and 322-2, and an n+ silicon emitter 352 that touches the top surface of SiGe base 350.

Schottky-clamped bipolar transistor 300 also includes a non-conductive layer 354 that touches the top surfaces of DTI structure 320, the STI structures 322, metal region 336, SiGe base 350, and emitter 352. Transistor 300 further includes a number of contacts 356 that extend through non-conductive layer 354 to make electrical connections with metal region 336, a silicided top surface of n+ collector sinker region 346, SiGe base 350, and silicon emitter 352. In addition, as schematically illustrated, metal region 336 of Schottky diode 310 is electrically connected to SiGe base 350.

In operation, metal region 336 functions as the anode of a Schottky diode, while the portion of n-single-crystal silicon region 324-1 that touches and lies directly vertically below metal region 336 function as the cathode of the Schottky diode. In addition, n+ buried layer 342 and n+ collector sinker region 346 of collector structure 340 function as the cathode collector of the Schottky diode. Further, p+ guard ring 332 reduces the leakage current.

As a result, when the voltage applied to SiGe base 350, and thereby metal region 336, rises above the voltage applied to n+ collector sinker region 346 by approximately 0.3V-0.4V, a current flows from SiGe base 350 to metal region 336 to n-single-crystal silicon region 324-1 to n+ buried layer 342 and to n+ collector sinker region 346. On the other hand, when the voltage applied to metal region 336 falls below the voltage applied to n+ collector sinker region 346, substantially no current flows from n+ collector sinker region 346 to metal region 336.

One of the advantages of Schottky-clamped bipolar transistor 300 is that since Schottky structure 310 and bipolar transistor 312 are formed in the same fully-isolated single-crystal silicon region 324-1, the effective length L is significantly increased. Significantly increasing the effective length L, in turn, significantly reduces the self heating experienced by a SiGe bipolar transistor in a fully-isolated single-crystal silicon region.

Figure 4:
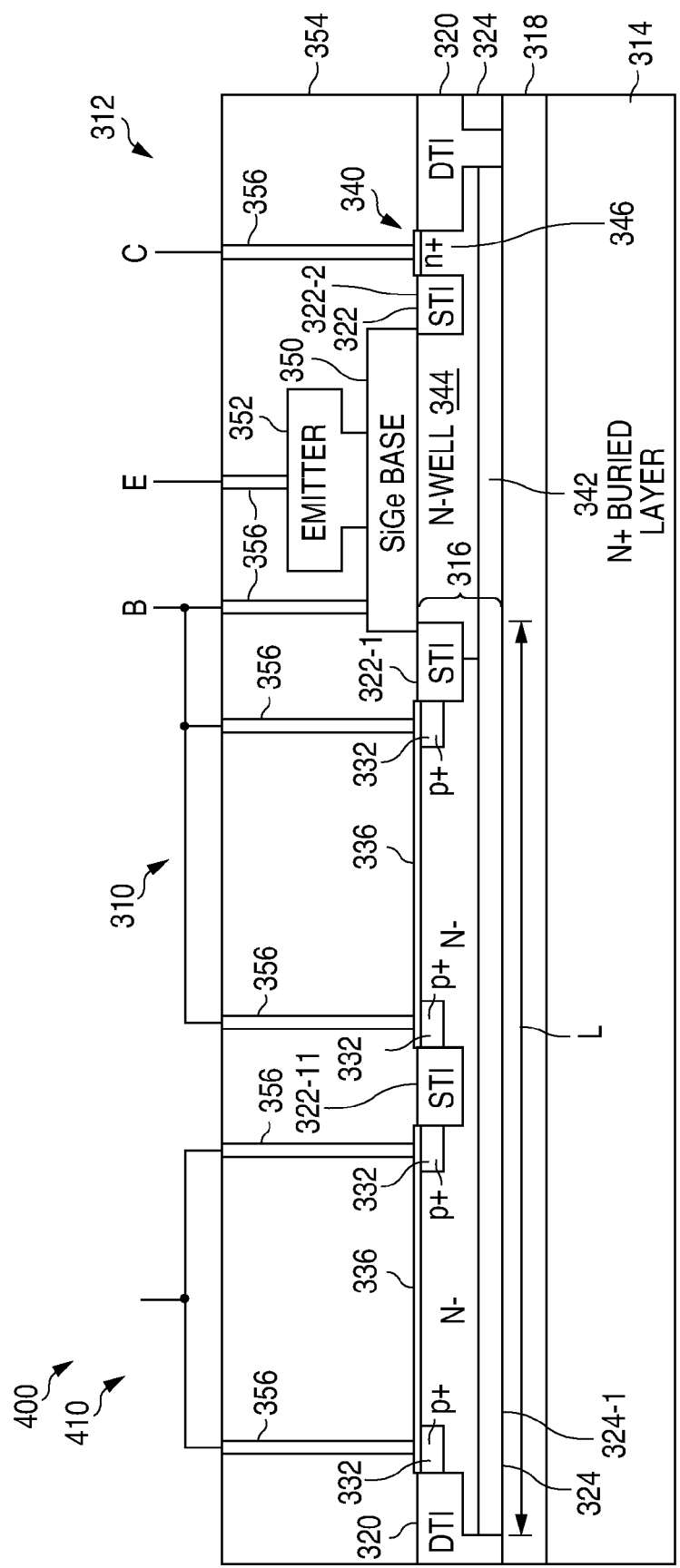
FIG. 4 is a cross-sectional view illustrating an example of a Schottky-clamped bipolar transistor 400 in accordance with an alternate embodiment of the present invention.

FIG. 4 shows a cross-sectional view that illustrates an example of a Schottky-clamped bipolar transistor 400 in accordance with an alternate embodiment of the present invention. Schottky-clamped bipolar transistor 400 is similar to Schottky-clamped bipolar transistor 300 and, as a result, utilizes the same reference numerals to designate the elements that are common to both devices.

As shown in FIG. 4, Schottky-clamped bipolar transistor 400 differs from Schottky-clamped bipolar transistor 300 in that Schottky-clamped bipolar transistor 400 has two Schottky structures, Schottky structure 310 and Schottky structure 410; and an STI region 322-11 that separates the structures 310 and 410. STI region 322-11 has a bottom surface that is spaced apart from the top surface of isolation layer 318 and, in the present example, from the top surface of n+ buried layer 342. Schottky structures 310 and 410 are identical and, as a result, utilize the same reference numerals. As a result, in the present example, metal region 336 of Schottky structure 410 also lies directly vertically over a portion of n+ buried layer 342.

Schottky structures 310 and 410 share a common cathode collector, i.e., n+ buried layer 342 and n+ collector sinker region 346 of collector structure 340. However, while metal region 336 of Schottky structure 310, which is connected to SiGe base 150, functions as the anode of a Schottky diode, metal region 336 of Schottky structure 410 functions as the anode of another Schottky diode which can be connected to another device, thereby providing support for additional types of circuits and further improving the effective length L (which further reduces the self heating). For example, the anode of Schottky structure 410, as well as the anodes of any additional Schottky structures 410, can be biased at different reverse bias conditions to support varactor and other applications.

Schottky-clamped bipolar transistors 300 and 400 can be formed by modifying conventional fabrication processes. For example, single-crystal silicon region 324-1 is formed in the same manner that the single-crystal silicon regions 124 are formed, except that single-crystal silicon region 324-1 is larger.

Similarly, the STI regions 322-1 and 322-2 are formed at the same time that STI ring 122-1 and STI region 122-2 are formed, except that STI region 322-1 is formed as a strip in the same single-crystal silicon region 324-1 that STI region 322-2 is formed. Further, transistor 312 is formed in the same manner that transistor 112 is formed.

In addition, Schottky structures 310 and 410 are formed in the same manner that Schottky diode 110 was formed, except that the steps required to form n+ cathode contact ring 130, metal ring 134, the contacts 156 connected to metal ring 134, and the metal trace connecting the contacts 156 to n+ collector sinker region 146 have been eliminated.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor structure comprising:
a bulk region;
an isolation layer that touches the bulk region;
a plurality of single-crystal silicon regions that touch the isolation layer, each single-crystal silicon region having a first conductivity type and being horizontally spaced apart and horizontally electrically isolated from each other single-crystal silicon region, the plurality of single-crystal silicon regions including a single-crystal silicon region, the single-crystal silicon region having a top surface;
an isolation region that touches the single-crystal silicon region;
a Schottky structure that touches the single-crystal silicon region; and
a bipolar transistor that touches the single-crystal silicon region, the Schottky structure and the bipolar transistor lying on opposite sides of the isolation region;
wherein a bottom surface of the isolation region is spaced apart from a top surface of the isolation layer;
wherein the bipolar transistor includes a buried layer of the first conductivity type that touches the top surface of the isolation layer, the buried layer having a dopant concentration, and lying below the bottom surface of the isolation strip;
wherein a top surface of the buried layer is spaced apart from the bottom surface of the isolation strip;
wherein the Schottky structure includes a metal region that touches a portion of the single-crystal silicon region; and
wherein the metal region of the Schottky structure lies directly vertically over a portion of the buried layer.

2. The semiconductor structure of claim 1 wherein the portion of the single-crystal silicon region touched by the metal region has a dopant concentration that is less than the dopant concentration of the buried layer.

3. The semiconductor structure of claim 1 wherein the bipolar transistor includes a well of the first conductivity type that touches and lies above the buried layer, the well having a dopant concentration that is smaller than the dopant concentration of the buried layer.

4. The semiconductor structure of claim 3 wherein the bipolar transistor includes a base of a second conductivity type that touches the well and a portion of the top surface of the single-crystal silicon region.

5. The semiconductor structure of claim 4 wherein the bipolar transistor includes an emitter of the first conductivity type that touches a top surface of the base.

6. The semiconductor structure of claim 1 wherein the Schottky structure includes a ring of a second conductivity type that touches the single-crystal silicon region and the metal region.

* * * * *